United States Patent [19]

Sakamoto

[11] Patent Number: 4,886,705

[45] Date of Patent: Dec. 12, 1989

[54] POLYPHENYLENE SULFIDE FILM

[75] Inventor: Seiji Sakamoto, Machida, Japan

[73] Assignee: Diafoil Company, Limited, Tokyo, Japan

[21] Appl. No.: 210,620

[22] Filed: Jun. 21, 1988

[30] Foreign Application Priority Data

Jul. 7, 1987 [JP] Japan ............................. 62-169383

[51] Int. Cl.$^4$ .............................................. B32B 5/16
[52] U.S. Cl. .................................... 428/328; 428/329; 428/331; 428/409; 428/419; 524/401; 524/425; 524/430; 524/447; 524/450; 524/609
[58] Field of Search ............... 524/401, 425, 430, 447, 524/450, 609; 428/328, 329, 331, 409, 419

[56] References Cited

U.S. PATENT DOCUMENTS

| | | | |
|---|---|---|---|
| 4,286,018 | 8/1981 | Aiakura et al. | 428/419 |
| 4,386,130 | 5/1983 | Hayashi et al. | 428/701 |
| 4,426,479 | 1/1984 | Deguchi et al. | 524/430 |
| 4,726,998 | 2/1988 | Ikenaga et al. | 428/480 |

*Primary Examiner*—Henry F. Epstein
*Assistant Examiner*—P. J. Ryan
*Attorney, Agent, or Firm*—Oblon, Spivak, McClelland, Maier & Neustadt

[57] ABSTRACT

Disclosed herein is a uniaxially or biaxially oriented polyphenylene sulfide film wherein the number of n-order of interference fringes Hn (per mm$^2$) as measured by a multiple interference method satisfies the following relations (1) and (2) at the same time:

$$30 \leq H_1 \leq 300 \quad (1)$$

$$10 \leq H_3 \leq 300 \quad (2)$$

17 Claims, No Drawings

POLYPHENYLENE SULFIDE FILM

BACKGROUND OF THE INVENTION

The present invention relates to a film composed of polyphenylene sulfide. More particularly, the present invention relates to a polyphenylene sulfide film having excellent slitting property and winding workability in the film forming process and also having high surface flatness and slipping property.

Polyethylene terephthalate films have been commonly used as conventionally industrial films. In recent years, however, a demand has arisen for the films further improved in heat-resistance.

Aromatic polyamide films and polyimide films are known as typical examples of the films having high heat-resistance. These films, however, are very high in production cost, since the starting materials are expensive and also the solution casting method is the only available means for forming such films.

As the materials to which the melt film-forming method advantageous in terms of film-forming cost is appliable and which have relatively high heat-resistance, polycarbonate, polyester carbonate, polyacrylate, polysulfone, polyetherimide, polyethersulfone, etc. are known. These materials, however, are poor in mechanical strength when formed into a film because of their amorphous property.

Thus, the films relatively low in production cost and having excellent heat-resistance and mechanical strength, are strongly required at present, and poly-p-phenylene sulfide (PPS) films are attracting attention as a film having a high possibility of meeting such demand.

Regarding such PPS films, U.S. Pat. No. 4,286,018 discloses a heat set biaxially oriented poly-p-phenylene sulfide film comprising predominantly a plurality of recurring units of the formula

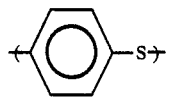

produced by a process which comprises (a) casting amorphous poly-p-phenylene sulfide film, (b) stretching said amorphous film within the range of about 2.0 to 5.0 times at a temperature between about 80° –120° C., so that the film birefringence in the stretching direction is between 0.05 to 0.30, thereafter (c) stretching said film in a direction transverse to that of step (b) within a range of about 1.5 to 5.0 times at a temperature between about 80° –150° C., thereby producing a biaxially stretched film, and (d) heat-setting said biaxially oriented film at a temperature between about 180° C. and the melting point.

Also, the operating conditions for forming such films are described in Japanese Patent Publication Nos. 59-5099 (1984), 59-5100 (1984), 59-5101 (1984), etc. The typical properties such as thermal, mechanical and electrical properties of such films are also known.

However, several problems remain to be overcome for realizing industrial production of such poly-p-phenylene sulfide films and practical use thereof as base films for various products.

For instance, in use of a poly-p-phenylene sulfide film as a base film for magnetic recording media or as a dielectric for capacitors, it is required that the film surface is flat and smooth for improving the electromagnetic transducing characteristics or dielectric properties, but an improvement of such surface flatness and slipperiness tends to cause a deterioration of slipping property of the film, thereby occurring troubles in handling of the film. Such antinomic phenomena can be improved to some extend by blending particles of a proper size in the film, but not enough study and disclosure have been made on this matter in connection to a poly-p-phenylene sulfide film.

According to the knowledges of the present inventors, the conventional poly-p-phenylene sulfide films tend to break when slit in the film-forming process, and also when the slitted film is wound up, there tends to take place non-uniform or irregular winding.

As a result of further studies for solving said problems, it has been found that by regulating the size and number of surface protuberances of a poly-p-phenylene sulfide film within the specified ranges, it is possible to obtain a flat and slippery film and also the winding workability in the film-forming process is greatly improved. The present invention was attained on the basis of such finding.

SUMMARY OF THE INVENTION

In an aspect of the present invention, there is provided a uniaxially or biaxially oriented polyphenylene sulfide film wherein the number of n-order of interference fringes Hn (per mm$^2$) as measured by a multiple interference method satisfies the following relations (1) and (2) at the same time:

$$30 \leq H_1 \leq 300 \tag{1}$$

$$10 \leq H_3 \leq 300 \tag{2}$$

DETAILED DESCRIPTION OF THE INVENTION

The essential of the present invention lies in a uniaxially or biaxially oriented polyphenylene sulfide film wherein the number of n-order (Hn) of interference fringes (per mm$^2$) measured by the multiple interference method satisfies the following relations (1) and (2) at the same time:

$$30 \leq H_1 \leq 300 \tag{1}$$

$$10 \leq H_3 \leq 300 \tag{2}$$

Various poly-p-phenylene sulfide (hereinafter referred to as PPS) compositions are usable for forming the film according to the present invention, but in view of heat-resistance and mechanical strength, it is preferred to use a PPS composition containing preferably not less than 80% by mole, more preferably not less than 85% by mole of p-phenylene sulfide units.

Examples of such PPS composition are (1) PPS homopolymers, (2) PPS copolymers, (3) blends of PPS homopolymers ane PPS copolymers, and (4) blends of polymers having m-phenylene sulfide as main repeating units with PPS homopolymers or PPS copolymers.

The PPS copolymers usable in the present invention are the poly-p-phenylene sulfide copolymers in which part of repeating units of p-phenylene sulfide is substituted with

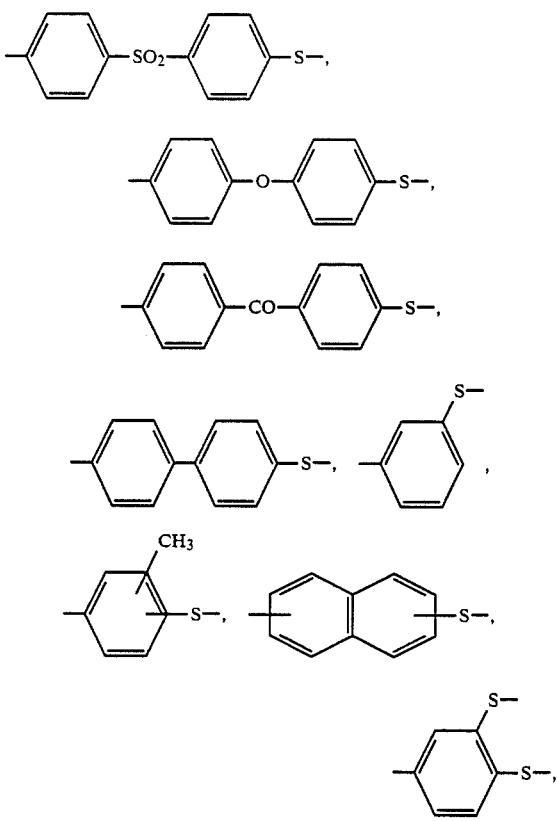

or the like.

In the present invention, it is preferred to use PPS homopolymers because of their excellent heat resistance, or the blends of PPS homopolymers and PPS copolymers because such blends are capable of improving the film-forming properties while maintaining heat resistance.

Preferred examples of such blends of PPS homopolymer and PPS copolymers are the polyphenylene sulfide blends containing not more than 20% by mole, preferably 2 to 10% by mole of m-phenylene sulfide units, obtained by blending two types of polyphenylene sulfide (i) and (ii) specified below:

(i) polyphenylene sulfide containing not less than 15% by mole of m-phenylene sulfide units:

(ii) polyphenylene sulfide containing not less than 95% by mole of p-phenylene sulfide units.

Various methods are available for polymerization of PPS used in the present invention, but usually the following method is preferably employed.

Dihalobenzene (such as p-dichlorobenzene) and as occasion demands, a halogen-substituted monomer capable of giving other repeating units, and an alkali sulfide, especially sodium sulfide are reacted in an amide type polar solvent such as N-methylpyrrolidone in the presence of a polymerization auxiliary at t high temperature and under a high pressure (U.S. Pat. No. 3,919,177).

In the present invention, it is of course possible to use other PPS compositions than said blends of (i) and (ii) as far as they are not prejudicial to the purpose of the present invention. It is also possible to blend other polymer(s) (such as polyester, polyamide, polyethylene, polystyrene, polycarbonate, polysulfone, polyethersulfone, polyimide, etc.) and/or if necessary, an additive(s) such as antioxidant, heat stabilizer, lubricant, ultraviolet absorber, etc., in an amount of about not more than 10% by weight based on the total amount of PPS.

The process for producing the films according to the present invention is described below.

A PPS composition such as mentioned above, especially a blend comprising the PPS composition and the particles of group (A) and group (B) (hereinafter referred to as PPS blend) is supplied into a known melt-extruder and heated to a temperature higher than the melting point of the PPS composition for melting the blend. Then the molten PPS blend of the PPS composition and the particles of groups (A) and (B) is extruded from a slit die and quickly solidified on a rotary cooling drum so that the temperature will become lower than the glass transition point to obtain a substantially amorphous non-oriented sheet. In this case, it is required to heighten the adhesion between sheet and rotary cooling drum for improving flatness of the sheet. In the present invention, an electrostatic cooling method is preferably employed for this purpose.

In the electrostatic cooling method, a linear electrode is provided on the upper side of the sheet in a direction orthogonal to the movement of the sheet and a DC voltage of about 5 to 10 KV is applied to the electrode to give static charges to the sheet, thereby improving the adhesion of the sheet to the drum.

In the present invention, the sheet thus obtained is uniaxially or biaxially stretched to form a film. Stretching of the sheet can be effected by longitudinally drawing while utilizing the difference in peripheral speed between the rolls, or by using a tentering method or a tubular method.

The stretching conditions are described more concretely below.

The unstretched sheet is first stretched 2 to 5 times in one direction at a temperature of 90° to 110° C. by a roll or tenter type stretching machine. Then, as occasion demands, the thus uniaxially stretched sheet is further stretched 1.5 to 5 times in a direction transverse to that of the first stretching at a temperature of 80° to 150° C., preferably 90° to 140° C., to obtain a biaxially oriented film. Of course the unstretched sheet may be stretched in both directions simultaneously so that the obtained film will have 3 to 30 times as large surface area as that of the original sheet.

The thus obtained uniaxially or biaxially stretched film is preferably subjected to a heat treatment at a temperature of 170° to 260° C. for 1 to 2 seconds for improving mainly dimensional stability. If necessary, before subjecting to such heat treatment, the film may be further stretched 1.02 to 2.0 times in the machine direction and/or transversal direction under the same conditions as described above to increase the orientation degree for further improving mechanical strength.

In the present invention, the uniaxially or biaxially stretched polyphenylene sulfide (PPS) film has a surface roughness which satisfies the specific requirements. Namely, the number of n-order ($H_n$) of interference fringes (per mm$^2$) as measured by the multiple interference method satisfies the following relations (1) and (2) at the same time:

$$30 \leq H_1 \leq 300 \quad (1)$$

$$10 \leq H_3 \leq 300 \quad (2)$$

Average roughness along the center line (Ra) is known as a means for indicating surface roughness of PPS films. However, the present inventors found that such indication by Ra can not accurately reflect the film properties, and that such film properties have a good correlativity with Hn, and by regulating Hn in the specified range of the present invention, there can be obtained an industrially useful PPS film. It is not definitely known reason why the useful PPS film can be obtained by regulating Hn in the specified range, but as regards slipping property and winding workability of PPS films, the distribution of fine protuberances on the film surface is considered to be an important factor, and regarding this point, it is considered that Hn can express more precisely the film properties than possible with Ra which gives little information on height of protuberances.

In the present invention, the number of primary interference fringes $H_1$ (per $mm^2$) as measured by the multiple interference method is in the range of 30 to 300, preferably 50 to 250. When $H_1$ is less than 30, the slipping property of the film are worsened, inducing various troubles in the film production process or in handling of the produced film. When $H_1$ exceeds 300, not only no further improvement of slipping property is provided but also the coarse protuberances tend to be formed due to overlapping of protuberances, thus impairing flatness of the film.

In the present invention, the number of tertiary interference fringes $H_3$ (per $mm^2$) measured by the multiple interference method is in the range of 10 to 300, preferably 30 to 250. When $H_3$ is less than 10, no satisfactory slipping property are obtained, and also there tend to occur nonuniform winding of the film, creasing of the film surface and unevenness at end face of the film roll. When $H_3$ exceeds 300, many coarse protuberances tend to be formed on the film surface to impair its flatness.

The ratio of $H_3$ to $H_1$ is preferably 0.2–5, more preferably 0.3–1.0.

Thus, it is a feature of the present invention that the roughness of film surface is defined in a specified range.

The PPS blend of the present invention is a mixture of a PPS composition and the particles of group (A) which form mainly the protuberances giving the primary interference fringes when measured by the multiple interference method and the particles of group (B) which form mainly the protuberances giving the tertiary interference fringes when measured by the multiple interference method. In the present invention, it is preferable to use said two types of particles (particles of group (A) and particles of group (B)) having an average particle size in the range of 0.01 to 5 μm.

The optimal size and amount of said two types of particles for providing the film surface condition which is a characteristic of the present invention can not be decided sweepingly since they are variable depending on the shape of the particles, their affinity for the PPS composition, stretching conditions and other factors. However, usually the preferred average diameter of the particles of group (A) is in the range of 0.01 to 5 μm, more preferably 0.1 to 1.5 μm, and the amount ratio of these particles to the PPS composition is preferably in the range of 0.01 to 0.5% by weight, more preferably 0.05 to 0.4% by weight.

The preferred average diameter of the particles of group (B) used in the present invention is in the range of 0.01 to 5 μm, more preferably 0.2 to 2 μm, and the amount ratio of such particles to the PPS composition is preferably in the range of 0.01 to 0.5% by weight, more preferably 0.05 to 0.4% by weight.

In the present invention, it is preferable that at least one of said two types of particles, preferably both types of particles are of a hardness in the range of 1 to 6, preferably 1 to 5 in Mohs' scale of hardness.

The uniaxially or biaxially oriented PPS film is slit and wound up into a roll. According to the knowledge of the present inventors, PPS films tend to break when slit, and this tendency is conspicuous when the Mohs' hardness of the particles contained in the film is high. In the present invention, therefore, it is preferable that at least one of the two types of particles blended is particles having a Mohs' hardness of 1 to 6, more preferably 1 to 5.

The interrelation between slitting characteristics of film and Mohs' hardness of particles is not definitely known, but it is considered that when Mohs' hardness of particles is high, the slitting knife tends to be worn delicately at the edge, making the film liable to be notched endwise, ultimately resulting in a break of the film.

As the particles of group (A) and the particles of group (B) used in the present invention, the followings can be exemplified as suitable examples (figures in the parentheses indicating Mohs' hardness): talc (1–1.5), kaolin (1–2.5), calcium carbonate (3), lithium fluoride (3.3), mordenite (3.5), calcium fluoride (4), zinc oxide (4–4.5), calcium silicate (4.5–5), zeolite (4–5), calcium phosphate (5), amorphous silica (5.5–6), magnesium oxide (5.5–6), anatase titanium dioxide (5.5–6), particles composed of heat-resistant organic crosslinked polymers (1–3), tin oxide (6.5), rutile titanium dioxide (6–7), crystalline silica (7), titanium black (8), alumina (9), silicon carbide (9), and titanium carbide (9).

As described above, it is possible according to the present invention to obtain an oriented PPS film which is flat and smooth on the surface and has excellent slitting property and winding workability in the film forming process. The thickness of such film is usually in the range of 1 to 1,000 μm, preferably 1 to 100 μm, more preferably 1 to 50 μm. The modulus of elasticity of said film is not lower than 300 kg/$mm^2$ in at least one direction, preferably not lower than 300 kg/$mm^2$ in both machine and transversal directions, more preferably not lower than 350 kg/$mm^2$ in both directions. The ultimate degree of crystallization of the film is preferably not lower than 20%, more preferably in the range of more than 30 and less than 60%. The coefficient of friction of the film is preferably not lower than 0.30.

The thus obtained PPS film of the present invention, with its excellent thermal and mechanical properties in addition to its good handleability, can be used in various ways such as electrical insulating film, packaging material, interior cover film, film for magnetic recording media, dielectric for capacitors, flexible printed circuit board, thermo-sensitive transfer film, etc.

The present invention will hereinafter be described in further detail with reference to the examples thereof, but it is to be understood that these examples are merely intended to be illustrative and not limitative of the scope of the invention.

The methods used for measurements and evaluations in the present invention are described below.

(1) Film-Forming Properties

Continuity of film forming at the time of transversal stretching where break of the film tends to take place was evaluated. The film-forming rate at the time of transversal stretching was set at 5,000%/min in the Examples and Comparative Examples. The number of times of break that took place per the film length of 10,000 meters in each film forming process was measured.
A: less than 2 times
B: 2 to 3 times
C: 4 or more times

(2) Winding Workability

The film winding workability in the film-forming process was evaluated into the following three grades A, B and C.
A: The film could be wound up smoothly without forming any wrinkles. The roll of film was uniform edgewise.
B: The film could be wound up with substantially no problem, but the film was wrinkled at times. Also, the roll of film was slightly uneven at the end face.
C: The film often meandered and was subject to creasing. Also, the roll of film was non-uniform at the end.

(3) Slitting Property

Each sample of biaxially stretched film was slit by using a knife type slitter. The length of film which remained unbroken in the slitting operation was measured, and the slitting property of film were evaluated as follows according to the no-break film length.
A: No-break film length exceeded 100,000 meters.
B: No-break film length was 50,000 to 100,000 meters.
C: No-break film length was less than 50,000 meters.

(4) Hn as Measured by Multiple Interference Method

Light was applied to the aluminum-deposited film surface to form the interference fringes according to a multiple interference method with a measuring wavelength of 0.54 μm and the number of the protuberances giving the first and third orders of interference fringes was determined by using a surface finish microscope made by Nippon Kogaku Kabushiki Kaisha.
The reflectance of the mirror used in the test was 65%, and the microscope used had a magnification of 200.

(5) Coefficient of Friction

Determined according to the method of ASTM D-1894.

EXAMPLE 1

Preparation of polyphenylene sulfide m-Dichlorobenzene, p-dichlorobenzene and sodium sulfide unhydrate were polymerized to obtain polyphenylene sulfide (A) containing blockwise 60% by mole of m-phenylene sulfide units. This polymer had a melting point of 197° C.

8 parts of polymer (A), 92 parts of poly-p-phenylene sulfide homopolymer, 0.2 part of kaolin having an average particle size of 0.7 μm and 0.03 part of calcium carbonate having an average particle size of 1.5 μm were blended to prepare a film forming material.

Preparation of polyphenylene sulfide film

The composition obtained in the manner described above was kneaded well at 300° C. in an extruder, extruded into a sheet from the T-die of 300 mm in width and 1 mm in lip interval and quickly cooled and solidified on a rotary cooling drum set at a surface temperature of 40° C. by utilizing an electrostatic cooling method to obtain a substantially amorphous sheet having a thickness of 150 μm.

The thus obtained sheet was stretched 3.5 times in the machine direction at 95° C. and then 3.0 times in the direction transverse thereto at 105° C., and heat-treated at 250° C. for 10 seconds to obtain a biaxially stretched film.

The properties of the obtained film are shown in Table 1. This film was excellent in coefficient of friction and winding workability owing to its proper surface roughness and also had excellent slitting property owing to the proper hardness of the particles contained in the film.

EXAMPLE 2-4

Biaxially stretched films were obtained in the same way as Example 1 except that the particles blended and/or the polymer were changed to those shown in Table 1. Any of the obtained films had the satisfactory properties.

COMPARATIVE EXAMPLES 1-3

Biaxially stretched films were obtained in the same way as Example 1 except that the particles blended were changed to those shown in Table 1. In Comparative Example 1, the winding workability was poor because of too low surface roughness. In Comparative Example 2, many "fish eyes" were present in the film due to too high surface roughness and the film was hardly serviceable for practival use. The slitting property was also excessively worsened due to too high hardness of the particles blended.

In Comparative Example 3 in which the surface roughness was even lower than Comparative Example 1, not only the winding workability was poor but also the coefficient of friction became extremely high and no film having satisfactory properties could be obtained.

TABLE 1

| Examples or Comp. Examples | Film-forming materials | | | Film properties | | | Characteristics in film production | | |
|---|---|---|---|---|---|---|---|---|---|
| | Polymer | Particles blended | | Surface roundness (per mm$^2$) | | Coefficient of friction | Film-forming properties | Winding Workability | Slitting property |
| | | | | $H_1$ | $H_3$ | | | | |
| Example 1 | m-phenylene sulfide block copolymer blend | Kaolin: 0.2 part, average particle size: 0.7 μm | Calcium carbonate: 0.03 part, average particle size: 1.5 μm | 121 | 40 | 0.35 | A | A | A |
| Example 2 | m-phenylene sulfide block copolymer blend | Calcium carbonate: 0.15 parts, average particle size: 0.8 μm | Zeolite: 0.05 part average particle size: 1.8 μm | 155 | 57 | 0.31 | A | A | A |
| Example 3 | m-phenylene sulfide block | Lithium fluride: 0.11 part, ave- | Amorphous silica: 0.04 part, ave- | 216 | 62 | 0.36 | A | A | A |

TABLE 1-continued

| Examples or Comp. Examples | Film-forming materials | | Film properties | | | Characteristics in film production | | |
|---|---|---|---|---|---|---|---|---|
| | Polymer | Particles blended | Surface roundness (per mm$^2$) | | Coefficient of friction | Film-forming properties | Winding Workability | Slitting property |
| | | | $H_1$ | $H_3$ | | | | |
| Example 4 | copolymer blend p-phenylene sulfide homopolymer | rage particle size: 1.2 μm Lithium fluride: 0.11 part, average particle size: 1.2 μm | rage particle size: 1.9 μm Amorphous silica: 0.04 part, average particle size: 1.9 μm | 207 | 63 | 0.37 | B | A | A |
| Comp. Example 1 | m-phenylene sulfide block copolymer blend | Kaolin: 0.2 part, average particle size: 0.7 μm | — | 185 | 7 | 0.42 | A | B-C | A |
| Comp. Example 2 | m-phenylene sulfide block copolymer blend | Alumina: 0.3 part, average particle size: 1.1 μm | — | 320 | 161 | 0.31 | A | A | C |
| Comp. Example 3 | m-phenylene sulfide block copolymer blend | Amorphous silica: 0.02 part, average particle size: 0.1 μm | — | 20 | 2 | 0.82 | A | C | A |

What is claimed is:

1. A uniaxially or biaxially oriented polyphenylene sulfide film selected from the group consisting of polyphenylene sulfide homopolymers, polyphenylene sulfide copolymers, blends of polyphenylene sulfide homopolymers and polyphenylene sulfide copolymers, blends of polymers having m-phenylene sulfide main repeating units and polyphenylene sulfide homopolymers or polyphenylene sulfide copolymers, said film containing two groups of particles, and said film having the number of n-order of interference fringes $H_n$ (per mm$^2$) as measured by a multiple interference method which satisfies the following relations (1) and (2) at the same time:

$$30 \leq H_1 \leq 300 \quad (1)$$

$$10 \leq H_3 \leq 300 \quad (2).$$

2. A film according to claim 1, which contains two groups of particles having an average diameter in the range of 0.1 to 5 μm.

3. A film according to claim 2, wherein at least one of said two groups of particles comprises the particles having a Mohs' hardness in the range of 1 to 6.

4. A film according to claim 1, wherein the content of each of said two groups of particles is 0.01 to 0.5% by weight based on the poly-p-phenylene sulfide composition.

5. A film according to claim 1, having a thickness of 1 to 1,000 μm.

6. A film according to claim 1, which has a modulus of elasticity of not lower than 300 kg/mm$^2$ in at least one direction.

7. A film according to claim 1, which has a coefficient of friction of not lower than 0.30.

8. A film according to claim 1, wherein the ratio of $H_3$ to $H_1$ is 0.2-5.

9. A film according to claim 1, which is obtained from a process comprising melting and extruding a poly-p-phenylene sulfide composition containing two groups of particles having an average particle size of 0.01 to 5 μm, quickly cooling and solidifying the extruded material to obtain an amorphous non-oriented sheet, and stretching said sheet uniaxially or biaxially.

10. A film according to claim 9, wherein the content of each of said two groups of particles is 0.01 to 0.5% by weight based on the poly-p-phenylene sulfide composition.

11. A film according to claim 9, wherein at least one of said two groups of particles comprises particles having a Mohs' hardness of 1 to 6.

12. A film according to claim 9, wherein the cooling treatment is conducted by an electrostatic cooling method for quick-cooling and solidifying the extruded material.

13. A film according to claim 9, wherein the uniaxially or biaxially stretched film is heat-treated at 170° to 260° C. for 1 to 10 seconds.

14. A film according to claim 9, wherein the uniaxially or biaxially stretched film is further stretched at least one direction and heat-treated at 170° to 260° C. for 1 to 10 seconds.

15. A film according to claim 1, wherein said particles are selected from the group consisting of talc, kaolin, calcium carbonate, lithium fluoride, mordenite, calcium fluoride, zinc oxide, calcium silicate, zeolite, calcium phosphate, amorphous silica, magnesium oxide, anatase titanium dioxide, particles composed of heat-resistant organic crosslinked polymers, tin oxide, rutile titanium oxide, crystalline silica, titanium black, alumina, silicon carbide and titanium carbide.

16. A film according to claim 1, wherein said particles have an average diameter of 0.1-1.5 microns.

17. A film according to claim 1, wherein the content of each of said two groups of particles is 0.5-0.4% by weight based on the poly-p-phenylene sulfide composition.

* * * * *

UNITED STATES PATENT AND TRADEMARK OFFICE
CERTIFICATE OF CORRECTION

PATENT NO. : 4,886,705
DATED : December 12, 1989
INVENTOR(S) : SEIJI SAKAMOTO

It is certified that error appears in the above-identified patent and that said Letters Patent is hereby corrected as shown below:

In column 10, line 59, claim 17, delete "0.5-0.4%" and insert therefor --0.05-0.4%--.

Signed and Sealed this

Fifth Day of November, 1991

*Attest:*

HARRY F. MANBECK, JR.

*Attesting Officer*

*Commissioner of Patents and Trademarks*